(12) United States Patent
Osaki et al.

(10) Patent No.: US 10,191,370 B2
(45) Date of Patent: Jan. 29, 2019

(54) COMPOSITION AND A METHOD FOR MANUFACTURING A COMPONENT

(71) Applicant: TOYO GOSEI CO., LTD., Ichikawa-shi, Chiba (JP)

(72) Inventors: Takeshi Osaki, Ichikawa (JP); Taigo Akasaki, Ichikawa (JP); Risa Wada, Ichikawa (JP)

(73) Assignee: Toyo Gosei Co., Ltd., Ichikawa-shi, Chiba (JP)

( * ) Notice: Subject to any disclaimer, the term of this patent is extended or adjusted under 35 U.S.C. 154(b) by 83 days.

(21) Appl. No.: 15/109,620

(22) PCT Filed: Jan. 7, 2015

(86) PCT No.: PCT/JP2015/000045
§ 371 (c)(1),
(2) Date: Jul. 1, 2016

(87) PCT Pub. No.: WO2015/105050
PCT Pub. Date: Jul. 16, 2015

(65) Prior Publication Data
US 2016/0326276 A1  Nov. 10, 2016

Related U.S. Application Data

(60) Provisional application No. 61/964,561, filed on Jan. 7, 2014.

(51) Int. Cl.
*G03F 7/027* (2006.01)
*G03F 7/028* (2006.01)
(Continued)

(52) U.S. Cl.
CPC ............ *G03F 7/027* (2013.01); *C08F 2/48* (2013.01); *C08F 2/50* (2013.01); *C08F 230/00* (2013.01);
(Continued)

(58) Field of Classification Search
CPC .......... G03F 7/004; G03F 7/027; G03F 7/028; G03F 7/0751; H01L 21/0271;
(Continued)

(56) References Cited

U.S. PATENT DOCUMENTS 4,612,384 A * 9/1986 Omura ................. C07F 9/091
522/171
2007/0160937 A1 7/2007 Ogino
(Continued)

FOREIGN PATENT DOCUMENTS

| JP | 03-28852 | 2/1991 |
| JP | 2007-186570 | 7/2007 |

(Continued)

OTHER PUBLICATIONS

PCT International Search Report dated Mar. 31, 2015, PCT/JP2015/000045.
PCT Written Opinion dated Mar. 31, 2015, PCT/JP2015/000045.

*Primary Examiner* — Amanda C. Walke
(74) *Attorney, Agent, or Firm* — TraskBritt, P.C.

(57) ABSTRACT

Compositions are for formation of etch-resistant resins. Such resins are useful for manufacturing components or devices.

20 Claims, 1 Drawing Sheet

(51) Int. Cl.
*G03F 7/004* (2006.01)
*G03F 7/075* (2006.01)
*H01L 21/033* (2006.01)
*C08F 230/02* (2006.01)
*H01L 21/027* (2006.01)
*C08F 230/00* (2006.01)
*C08F 2/48* (2006.01)
*C08F 2/50* (2006.01)
*H01J 37/32* (2006.01)
*B82Y 40/00* (2011.01)
*B82Y 30/00* (2011.01)

(52) U.S. Cl.
CPC ............ *C08F 230/02* (2013.01); *G03F 7/004* (2013.01); *G03F 7/028* (2013.01); *G03F 7/0751* (2013.01); *H01J 37/32009* (2013.01); *H01L 21/0271* (2013.01); *H01L 21/0273* (2013.01); *H01L 21/0337* (2013.01); *B82Y 30/00* (2013.01); *B82Y 40/00* (2013.01); *H01J 2237/334* (2013.01)

(58) Field of Classification Search
CPC ............ H01L 21/0273; H01L 21/0337; C08F 230/00; C08F 230/02; C08L 33/00; C08L 33/02

USPC .................................................. 430/322, 913
See application file for complete search history.

(56) References Cited

U.S. PATENT DOCUMENTS

| | | |
|---|---|---|
| 2009/0283937 A1 | 11/2009 | Kodama et al. |
| 2011/0213093 A1* | 9/2011 | Sakurai ................... G02B 1/041 |
| | | 525/326.6 |
| 2013/0260315 A1 | 10/2013 | Sato |
| 2015/0234273 A1* | 8/2015 | Matsuura ............... G03F 7/0275 |
| | | 428/195.1 |
| 2016/0136081 A1* | 5/2016 | Reierson ................. A61K 8/817 |
| | | 424/53 |
| 2017/0226249 A1* | 8/2017 | Abe ....................... C08F 220/14 |
| 2017/0298173 A1* | 10/2017 | Calhoun ................. C08G 79/02 |

FOREIGN PATENT DOCUMENTS

| | | |
|---|---|---|
| JP | 2008-238416 | 10/2008 |
| JP | 2008-273999 | 11/2008 |
| JP | 2009-218550 | 9/2009 |
| JP | 2010242107 | 10/2010 |
| JP | 2012-128273 | 7/2012 |
| JP | 201457016 | 3/2014 |
| WO | 2012074025 | 6/2012 |
| WO | 2015105050 | 7/2015 |

* cited by examiner

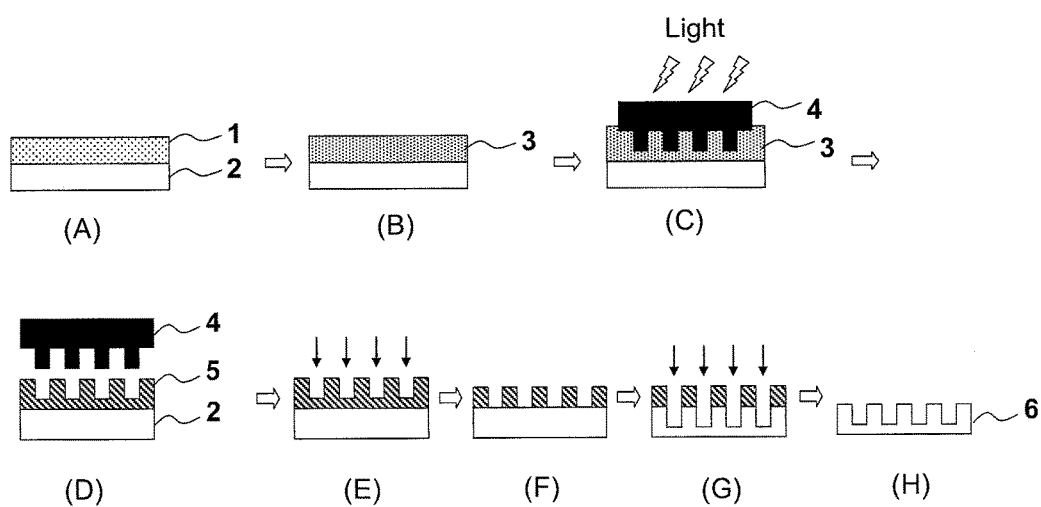

COMPOSITION AND A METHOD FOR MANUFACTURING A COMPONENT

CROSS REFERENCE TO RELATED APPLICATION

This application is a national phase entry under 35 U.S.C. § 371 of International Patent Application PCT/JP2015/000045, filed Jan. 7, 2015, designating the United States of America and published in English as International Patent Publication WO 2015/105050 on Jul. 16, 2015, which claims the benefit under 35 U.S.C. section 119(e) of U.S. Provisional Patent Application Ser. No. 61/964,561 filed on Jan. 7, 2014, the disclosure of which is hereby incorporated herein in its entirety by this reference.

TECHNICAL FIELD

Several aspects of the application relate to the fields of compositions and manufacturing components.

BACKGROUND

Resins having excellent characteristics such as resistance to heat have been desired. Such resins can be suitable for optical or electronic components of devices because such resin can show suppression of deformation or dimensional change by heat generated during operation of device.

Radically curable compositions suitable for nanoimprinting are disclosed in JP 2008-238416 (laid-open disclosure date: Oct. 9, 2008).

SUMMARY OF INVENTION

A composition relating to an aspect of the disclosure is characterized by that a resin generated by curing the composition has a dry etching rate equal to or smaller than 140 nm/min. It is preferred that the dry etching rate is measured in a plasma generated under a condition in which a flow rate of $O_2$ is 10 sccm.

With regard to the composition, it is preferred that the composition have a viscosity equal to or smaller than 104800 mPa·s.

With regard to the composition, it is preferred that the composition have a viscosity equal to or smaller than 81100 mPa·s. More preferably, the composition has a viscosity less than or equal to 6800 mPa·s.

A composition relating to an aspect of the disclosure is characterized by that the composition has a viscosity equal to or smaller than 104800 mPa·s.

With regard to the composition, it is preferred that the composition is photo-curable.

With regard to the composition, it is preferred that: the resin have a dry etching rate equal to or smaller than 131 nm/min; and the dry etching rate is measured in a plasma generated under a condition in which a flow rate of $O_2$ is 10 sccm.

With regard to the composition, it is more preferred that the plasma is generated under the condition in which an intensity of a radio frequency generating the plasma is 350 W, a frequency of the radio frequency is 13.56 MHz and the resin is exposed to the plasma for 5 minutes.

With regard to the composition, it is preferred that the composition contains a first compound.

With regard to the composition, it is preferred that the first compound have only one polymerizable group.

With regard to the composition, it is preferred that the composition further contains a second compound having at least two cyclic moieties.

With regard to the composition, it is preferred that the composition further contains a second compound having at least two polymerizable groups.

With regard to the composition, it is preferred that the first compound have an Ohnishi parameter equal to or smaller than 2.60.

With regard to the composition, it is preferred that the first compound in itself having a viscosity equal to or smaller than 150 mPa·s.

With regard to the composition, it is preferred that the second compound in itself have a viscosity equal to or greater than 100000.

With regard to the composition, it is preferred that the first compound have at least two cyclic moieties. At least one of the cyclic moieties can be an aromatic ring or alicyclic ring.

With regard to the composition, it is preferred that the first compound contains at most three oxygen atoms.

With regard to the composition, it is preferred that the composition have an Ohnishi parameter equal to or smaller than 2.59.

It is more preferred that the Ohnishi parameter is equal to or smaller than 2.54. Especially, it is more preferred that the Ohnishi parameter ranges from 2.49 to 2.54.

A composition relating to an aspect of the disclosure is characterized by that: the composition has an Ohnishi parameter of less than or equal to 2.59; and the composition is capable of being filled in each of a plurality of concavities formed in a mold.

With regard to the composition, it is preferred that each of the plurality of concavities has a width of less than or equal to 1000 nm.

With regard to the composition, it is more preferred that each of the plurality of concavities has a width of less than or equal to 100 nm.

With regard to the composition, it is preferred that the composition is capable of being utilized for manufacturing a device or a component utilizing nanoimprint technology.

A method for manufacturing a component relating to an aspect of the disclosure includes: preparing any one of the compositions mentioned above; and forming a resin by curing such a composition in a state in which the composition is sandwiched between a first member and a second member.

With regard to the method, it is preferred that the first member is a mold in which a plurality of concave portions or a plurality of convex portions are formed.

A method for manufacturing a component relating to an aspect of the disclosure includes: preparing any one of the compositions mentioned above; and forming a resin by curing such a composition in a state in which the composition is sandwiched between a first member and a second member, wherein the forming of the resin is carried out such that the resin has a first portion and a second portion of which thickness is greater than a thickness of the first portion are formed.

With regard to the method, it is preferred that the method further includes etching of the resin.

With regard to the method, it is more preferred that the method further includes etching of the resin carried out such that the first portion is removed and the second portion remains.

With regard to the method, it is preferred that the method further include removing the second portion after the etching of the resin is carried out.

A method for manufacturing a device relating to an aspect of the disclosure is characterized by that the method is carried out utilizing any one of the compositions mentioned above.

A method for manufacturing a device relating to an aspect of the disclosure is characterized by that the method is carried out utilizing the component manufactured by any one of the methods mentioned above.

BRIEF DESCRIPTION OF DRAWINGS

In the drawings, which illustrate what is currently considered to be the best mode for carrying out the invention:

FIG. 1 shows a typical manufacturing process for a component or a device utilizing a composition relating to an aspect of the disclosure.

DETAILED DESCRIPTION

Compositions are prepared by mixing Initiator A or B acting as a radical initiator with at least one of groups consisting of Compound A, Compound B, Compound C, Compound D, Compound E and Compound F. Among Compounds A-F, each of compounds other than Compound B contains at least one aromatic group which can contribute to improvement of etch-resistant property. Compound G or Compound H can be used as a constituent of the compositions as appropriate while at least one surfactant can be used as a constituent of the compositions as appropriate. Surfactant A, Surfactant B, Surfactant C and Surfactant D are Polyflow No. 75 (Kyoeisya Chemical Co., Ltd.), Polyflow No. 99C (Kyoeisya Chemical Co., Ltd.), MEGAFACE F-554 (DIC Corporation) and MEGAFACE F-552 (DIC Corporation), respectively. Each of Surfactant A and Surfactant B has a polymeric moiety while each of Surfactant C and Surfactant D has at least one fluorine atom.

Chem. 1

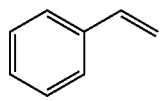

Compound A

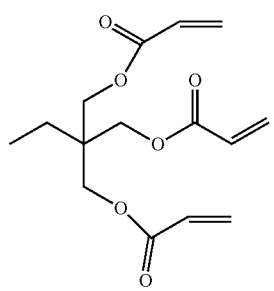

Compound B

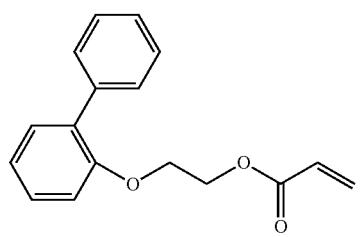

Compound C

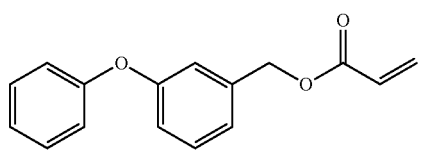

Compound D

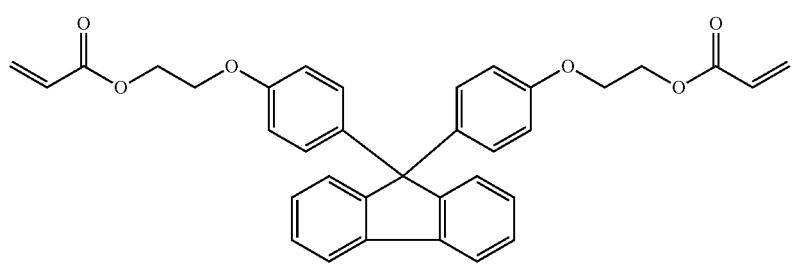

Compound E

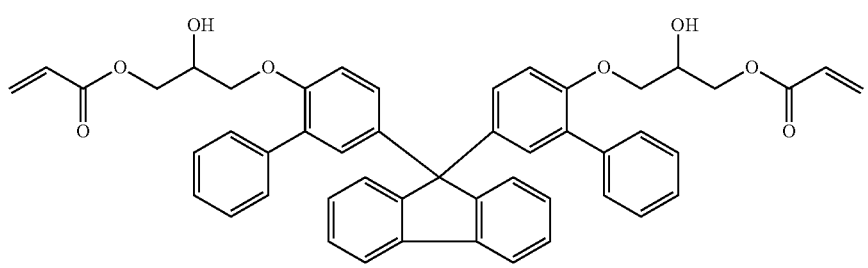
Compound F

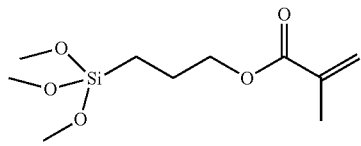
Compound G

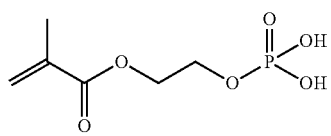
Compound H

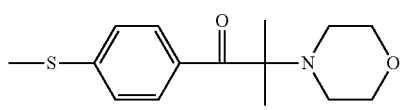
Initiator A

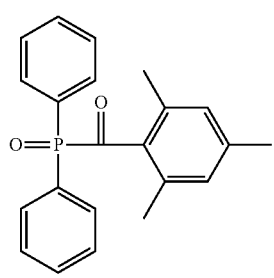
Initiator B

TABLE 1

Table Constituents (ratio by weight) of compositions and characteristic values

| | Compositions | | | | | |
|---|---|---|---|---|---|---|
| | 1 | 2 | 3 | 4 | 5 | 6 |
| Compound A | 95 | | | | | |
| Compound B | | 95 | | | | |
| Compound C | | | 95 | | | |
| Compound D | | | | 95 | | |
| Compound E | | | | | 95 | |
| Compound F | | | | | | 95 |
| Compound G | | | | | | |
| Compound H | | | | | | |
| Initiator A | 5 | 5 | 5 | 5 | 5 | 5 |
| Initiator B | | | | | | |
| Surfactant A | | | | | | |
| Surfactant B | | | | | | |
| Surfactant C | | | | | | |
| Surfactant D | | | | | | |
| Ohnishi Parameter | 2.03 | 4.36 | 2.59 | 2.58 | 2.48 | 2.41 |
| Viscosity (mPa · s) | 0.7 | 120 | 150 | 18 | >100,000 | >100,000 |
| Spin coating | — | g | g | — | g | g |
| Adhesion to substrate | — | g | g | — | g | g |
| Filling time (100 nm) | — | ≤1 min | ≤1 min | — | ≥15 min | ≥15 min |

TABLE 1-continued

Table Constituents (ratio by weight) of compositions and characteristic values

|  |  | Compositions | | | | | |
| --- | --- | --- | --- | --- | --- | --- | --- |
|  |  | 1 | 2 | 3 | 4 | 5 | 6 |
| Filling time (1000 nm) |  | — | ≤1 min | ≤1 min | — | ≥15 min | ≥15 min |
| Pattern profile |  | u | f | f | c | f | f |
| Dry etching rate (nm/min) | $O_2$ gas | — | 187 | 134 | — | 91 | 88 |
|  | $C_3F_8$ gas | — | 192 | 114 | — | 109 | 106 |
| Ratio of dry etching rate | $O_2$ gas | — | 1.000 | 0.717 | — | 0.487 | 0.471 |
|  | $C_3F_8$ gas | — | 1.000 | 0.594 | — | 0.568 | 0.552 | e: excellent;
g: good;
f: fine;
c: cohesive failure;
u: uncured

Table 1 shows compositions prepared by mixing a radical initiator with one of the group consisting of Compound A, Compound B, Compound C, Compound D, Compound E and Compound F.

"Spin coating" in the table means coating property of the composition. "g" indicates that a coating film of the solution disposed on the substrate has no deficit after removal of the solvent from the solution while "ng" indicates that a coating film of the solution disposed on the substrate has deficit after solvent is removed from the solution by heating the applied solution at 80 degrees Celsius for 2 minutes.

"Adhesion to substrate" is evaluated by cross-cut tests. The cross-cut tests are carried out as follows. Each of solutions of the resin compositions is applied to a substrate by spin coating. Solvent is removed from the solution by heating the applied solution at 80 degrees Celsius for 2 minutes. A film is formed by exposing the applied solution to a light of 1 J/cm2 under a nitrogen atmosphere. A cut is made in the film in a grid and the film with cut in the grid is exfoliated with tape. "g" indicates that the film with cut in the grid shows no exfoliation from the substrate while "e" indicates that the film with cut in the grid shows no exfoliation from the substrate even in cross-section observation by scanning electron microscopy method.

"Filling time (100 nm)" and "Filling time (1000 nm)" mean press time required for each of the compositions to be filled in a concave portion having width of 100 nm and a concave portion having width of 1000 nm, respectively. Relatively short filling time is one of important factors for applicability of the composition to nanoimprint technology.

"Pattern profile" means pattern shape of a resin formed by curing each of the compositions. "f" indicates that pattern shape is formed in a form predetermined by pattern formed in the mold while "c" indicates that pattern shape is not formed in the form by cohesive failure. "n" means that the composition is not cured.

"Dry etching rate" means the dry etching rate of the resin obtained by curing the composition measured after exposure to oxygen and fluorine plasma.

Dry etching rates are evaluated as follows. Each of films is formed by curing resin composition disposed on a substrate with a light of 1 J/cm2 under a nitrogen atmosphere. The surface of the substrate is exposed by removing a part of the film. A gap between the exposed surface of the substrate and the surface of the film is measured by a film thickness meter at predetermined time intervals from the start of exposure of the film to plasma. Dry etching rates are evaluated by changes of the gap with the passage of time measured by the film thickness meter.

Oxygen plasma is generated by application of a radio wave under a condition in which a flow rate of $O_2$ is 10 sccm. The intensity of the radio wave to create plasma is 350 W while the frequency of the radio wave is 13.56 MHz. That the dry etching rate is low usually means that the resin is etch-resistant.

Fluorine plasma is generated by utilizing ICP-RIE device under condition in which a flow rate of C3F8 is 20 sccm. The fluorine plasma is generated under condition in which the ICP power, the bias power and the internal temperature are 600 W, 50 W and 23 degrees Celsius, respectively.

"Ratio of dry etching rate" means a ratio of the dry etching rate of a resin formed by curing a composition to that of the resin formed by curing the composition (Composition 2) containing 95 percent by weight of Compound B and 5 percent by weight of the radical initiator.

The dry etching rate of the resin obtained by curing the composition (Composition 2) containing 95 percent by weight of Compound B and 5 percent by weight of the radical initiator is relatively high compared to resins obtained from the other compositions shown in Table 1. In connection with this, the Ohnishi parameter of the composition containing Compound B is higher than those of the other compositions.

The dry etching rate of the resin formed by curing the composition (Composition 3) containing 95 percent by weight of Compound C and 5 percent by weight of the radical initiator is 134 for oxygen plasma while the dry etching rate is 114 for fluorine plasma.

The pattern profile of the resin formed by curing the composition (Composition 4) containing 95 percent by weight of Compound D and 5 percent by weight of the radical initiator is "c," which means that the resin does not exhibit adequate formability.

The resin formed by curing the composition (Composition 5) containing 95 percent by weight of Compound E and 5 percent by weight of the radical initiator exhibits adequate formability. However, the filling times are longer.

The resin formed by curing the composition (Composition 6) containing 95 percent by weight of Compound F and 5 percent by weight of the radical initiator exhibits adequate formability. However, the filling times are longer.

The resin formed by curing the composition (Composition 1) containing 95 percent by weight of Compound A and 5 percent by weight of the radical initiator does not adequate formability.

TABLE 2

Constituents (ratio by weight) of compositions and characteristic values

| | | Compositions | | | | | | |
|---|---|---|---|---|---|---|---|---|
| | | 7 | 8 | 9 | 10 | 11 | 12 | 13 |
| Compound A | | | | | | | | |
| Compound B | | | | | | | | |
| Compound C | | | | | | | | |
| Compound D | | 90 | 70 | 60 | 50 | 45 | 40 | 35 |
| Compound E | | 5 | 25 | 35 | 45 | 50 | 55 | 60 |
| Compound F | | | | | | | | |
| Compound G | | | | | | | | |
| Compound H | | | | | | | | |
| Initiator A | | 5 | 5 | 5 | 5 | 5 | 5 | 5 |
| Initiator B | | | | | | | | |
| Surfactant A | | | | | | | | |
| Surfactant B | | | | | | | | |
| Surfactant C | | 0.05 | 0.05 | 0.05 | 0.05 | 0.05 | 0.05 | 0.05 |
| Surfactant D | | | | | | | | |
| Ohnishi Parameter | | 2.56 | 2.54 | 2.53 | 2.82 | 2.52 | 2.52 | 2.51 |
| Viscosity (mPa·s) | | 18 | 100 | 190 | 550 | 1,700 | 2,600 | 4,200 |
| Spin coating | | e | e | e | e | e | e | e |
| Adhesion to substrate | | g | g | g | g | g | g | g |
| Filling time (100 nm) | | ≤1 min | ≤1 min | ≤1 min | ≤1 min | ≤1 min | ≤5 min | ≤5 min |
| Filling time (1000 nm) | | ≤1 min | ≤1 min | ≤1 min | ≤1 min | ≤1 min | ≤1 min | ≤1 min |
| Pattern profile | | f | f | f | f | f | f | f |
| Dry etching rate (nm/min) | $O_2$ gas | 130 | 113 | 114 | 107 | 110 | 113 | 112 |
| | $C_3F_8$ gas | 123 | 122 | 122 | 106 | 110 | 101 | 101 |
| Ratio of dry etching rate | $O_2$ gas | 0.695 | 0.604 | 0.610 | 0.572 | 0.588 | 0.604 | 0.599 |
| | $C_3F_8$ gas | 0.641 | 0.635 | 0.635 | 0.573 | 0.552 | 0.526 | 0.526 |

| | | Compositions | | | | |
|---|---|---|---|---|---|---|
| | | 14 | 15 | 16 | 17 | 18 |
| Compound A | | | | | | |
| Compound B | | | | | | |
| Compound C | | | | | | |
| Compound D | | 30 | 25 | 20 | 15 | 5 |
| Compound E | | 65 | 70 | 95 | 80 | 90 |
| Compound F | | | | | | |
| Compound G | | | | | | |
| Compound H | | | | | | |
| Initiator A | | 5 | 5 | 5 | 5 | 5 |
| Initiator B | | | | | | |
| Surfactant A | | | | | | |
| Surfactant B | | | | | | |
| Surfactant C | | 0.05 | 0.05 | 0.05 | 0.05 | 0.05 |
| Surfactant D | | | | | | |
| Ohnishi Parameter | | 2.5 | 2.5 | 2.49 | 2.49 | 2.48 |
| Viscosity (mPa·s) | | 6,800 | 16,500 | 35,100 | 81,100 | >100,000 |
| Spin coating | | e | e | e | e | e |
| Adhesion to substrate | | g | g | g | g | g |
| Filling time (100 nm) | | ≤10 min | ≤15 min | ≤15 min | ≤15 min | ≤15 min |
| Filling time (1000 nm) | | ≤1 min | ≤5 min | ≤5 min | ≤10 min | ≤15 min |
| Pattern profile | | f | f | f | f | f |
| Dry etching rate (nm/min) | $O_3$ gas | 111 | 113 | 110 | 106 | 104 |
| | $C_3F_8$ gas | 101 | 101 | 100 | 100 | 100 |
| Ratio of dry etching rate | $O_3$ gas | 0.594 | 0.604 | 0.588 | 0.567 | 0.556 |
| | $C_3F_8$ gas | 0.526 | 0.526 | 0.521 | 0.521 | 0.521 | e: excellent;
g: good;
f: fine;
c: cohesive failure;
u: uncured

The dry etching rate of Composition 7 is 130 nm/min for oxygen plasma while the dry etching rate is 123 for fluorine plasma. The dry etching rate of Composition 18 is 104 nm/min for oxygen plasma while the dry etching rate of Composition 18 is 100 nm/min for fluorine plasma. Compositions 7-18 show relative low etching rate for both oxygen plasma and fluorine plasma, which means that the compositions are suitable for forming etch-resistant resins. Since Compositions 7-17 show relatively short filling time in addition to the low dry etching rates, the compositions are especially suitable for nanoimprint technology. Since Compositions 7-11 show short filling time irrespective of pattern size, the compositions have general versatility in nanoimprint technology.

It is more preferred that the dry etching rate for oxygen plasma ranges from 105 to 115 while the dry etching rate for fluorine plasma ranges from 100 to 122 to ensure compatibility between high etch-resistance and general versatility in nanoimprint technology. Alternatively, it is more preferred that Ohnishi parameter of the composition ranges from 2.49 to 2.54 to attain the compatibility.

TABLE 3

Constituents (ratio by weight) of compositions and characteristic values

| | | Compositions | | | | | |
|---|---|---|---|---|---|---|---|
| | | 19 | 20 | 21 | 22 | 23 | 24 |
| Compound A | | | | | | | |
| Compound B | | | | | | | |
| Compound C | | 90 | 70 | 65 | 60 | 55 | 50 |
| Compound D | | | | | | | |
| Compound E | | 5 | 25 | 30 | 35 | 40 | 45 |
| Compound F | | | | | | | |
| Compound G | | | | | | | |
| Compound H | | | | | | | |
| Initiator A | | 5 | 5 | 5 | 5 | 5 | 5 |
| Initiator B | | | | | | | |
| Surfactant A | | | | | | | |
| Surfactant B | | | | | | | |
| Surfactant C | | 0.05 | 0.05 | 0.05 | 0.05 | 0.05 | 0.05 |
| Surfactant D | | | | | | | |
| Ohnishi Parameter | | 2.59 | 2.56 | 2.56 | 2.54 | 2.54 | 2.54 |
| Viscosity (mPa · s) | | 190 | 770 | 1,400 | 1,700 | 2,800 | 4,000 |
| Spin coating | | e | e | e | e | e | e |
| Adhesion to substrate | | g | g | g | g | g | g |
| Filling time (100 nm) | | ≤1 min | ≤1 min | ≤1 min | ≤1 min | ≤5 min | ≤5 min |
| Filling time (1000 nm) | | ≤1 min | ≤1 min | ≤1 min | ≤1 min | ≤1 min | ≤1 min |
| Pattern profile | | f | f | f | f | f | f |
| Dry etching rate (nm/min) | $O_2$ gas | 131 | 120 | 109 | 109 | 109 | 109 |
| | $C_3F_8$ gas | 140 | 138 | 138 | 137 | 137 | 137 |
| Ratio of dry etching rate | $O_2$ gas | 0.701 | 0.642 | 0.583 | 0.583 | 0.583 | 0.583 |
| | $C_3F_8$ gas | 0.729 | 0.719 | 0.719 | 0.714 | 0.714 | 0.714 |

| | | Compositions | | | | |
|---|---|---|---|---|---|---|
| | | 25 | 26 | 27 | 28 | 29 |
| Compound A | | | | | | |
| Compound B | | | | | | |
| Compound C | | 45 | 35 | 25 | 20 | 5 |
| Compound D | | | | | | |
| Compound E | | 50 | 60 | 70 | 75 | 90 |
| Compound F | | | | | | |
| Compound G | | | | | | |
| Compound H | | | | | | |
| Initiator A | | 5 | 5 | 5 | 5 | 5 |
| Initiator B | | | | | | |
| Surfactant A | | | | | | |
| Surfactant B | | | | | | |
| Surfactant C | | 0.05 | 0.05 | 0.05 | 0.05 | 0.05 |
| Surfactant D | | | | | | |
| Ohnishi Parameter | | 2.53 | 2.52 | 2.51 | 2.5 | 2.48 |
| Viscosity (mPa · s) | | 6,800 | 19,200 | 62,300 | 104,800 | >110,000 |
| Spin coating | | e | e | e | e | e |
| Adhesion to substrate | | g | g | g | g | g |
| Filling time (100 nm) | | ≤10 min | ≥15 min | ≥15 min | ≥15 min | ≥15 min |
| Filling time (1000 nm) | | ≤1 min | ≤5 min | ≤5 min | ≤10 min | ≥15 min |
| Pattern profile | | f | f | f | f | f |
| Dry etching rate | $O_2$ gas | 108 | 107 | 107 | 106 | 104 |
| (nm/min) | $C_3F_8$ gas | 136 | 136 | 135 | 135 | 134 |
| Ratio of dry etching | $O_2$ gas | 0.578 | 0.572 | 0.572 | 0.567 | 0.556 |
| rate | $C_3F_8$ gas | 0.708 | 0.708 | 0.703 | 0.708 | 0.635 | e: excellent;
g: good;
f: fine;
c: cohesive failure;
u: uncured

The dry etching rate of Composition 19 for oxygen plasma is 131 nm/min while the dry etching rate of Composition 19 for fluorine plasma is 140 nm/min. The dry etching rate of Composition 29 for oxygen plasma is 104 nm/min while the dry etching rate of Composition 29 for fluorine plasma is 134 nm/min. Compositions 19-29 show relative low etching rate, which means that the compositions are suitable for forming etch-resistant resins. Since Compositions 19-28 also show relatively short filling time in addition to the low dry etching rates, the compositions are especially suitable for nanoimprint technology. Since Composition 19-22 show short filling time irrespective of pattern size, the compositions have general versatility in nanoimprint technology.

It is more preferred that the dry etching rate of the composition for oxygen plasma ranges from 105 to 115 while the dry etching rate of the composition for fluorine plasma ranges from 135 to 140 to ensure compatibility between high etch-resistance and general versatility in nanoimprint technology. Alternatively, it is more preferred that Ohnishi parameter of the composition ranges from 2.49 to 2.54 to attain the compatibility.

It is more preferred that at least one of polymerizable compounds contained in compositions has only one polymerizable group like Compound C and Compound D while another of the polymerizable compounds has at least two polymerizable groups like Compound E.

Chem.2

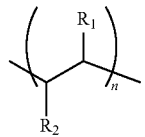

(I)

where R 1 is a hydrogen atom, a halogen atom, a substituent containing an oxygen atom, a sulfur atom, a carbon atom and a silicon atom; and R1 is a hydrogen atom,

TABLE 4

Constituents (ratio by weight) of compositions containing at least one surfactant and characteristic values

| | Compositions | | | | | | | | | | | |
|---|---|---|---|---|---|---|---|---|---|---|---|---|
| | 30 | 31 | 32 | 33 | 34 | 35 | 36 | 37 | 38 | 39 | 40 | 41 |
| Compound A | | | | | | | | | | | | |
| Compound B | | | | | | | | | | | | |
| Compound C | | | | | | | | | | | | |
| Compound D | 50 | 50 | 50 | 50 | 50 | 60 | 50 | 50 | 40 | 60 | 50 | 40 |
| Compound E | 45 | 45 | 45 | 45 | 45 | 35 | 45 | 45 | 55 | 5 | 15 | 25 |
| Compound F | | | | | | | | | | 30 | 30 | 30 |
| Compound G | 5 | 5 | 5 | 5 | 5 | 5 | 5 | 5 | 5 | | | |
| Compound H | 0.2 | 0.2 | 0.2 | 0.2 | 0.2 | 0.2 | 0.2 | 0.2 | 0.2 | | | |
| Initiator A | | | | | | | | | | | | |
| Initiator B | 5 | 5 | 5 | 5 | 5 | 5 | 5 | 5 | 5 | 5 | 5 | 5 |
| Surfactant A | | | | | | | | | | 0.05 | 0.05 | 0.05 |
| Surfactant B | 0.5 | 1.2 | 1.5 | | | 1.2 | 1.2 | 1.2 | 1.2 | | | |
| Surfactant C | | | | | | | | | | | | |
| Surfactant D | | | | 1 | 1.5 | 0.05 | 0.01 | 0.05 | 0.05 | | | |
| Ohnishi Parameter | 2.57 | 2.57 | 2.57 | 2.57 | 2.57 | 2.58 | 2.57 | 2.57 | 2.56 | 2.48 | 2.47 | 2.46 |
| Viscosity (mPa · s) | ≤550 | ≤550 | ≤550 | ≤550 | ≤550 | ≤190 | ≤550 | ≤550 | ≤2,600 | ≥190 | ≥550 | ≥2,600 |
| Spin coating | g | g | g | g | g | e | e | e | e | e | e | e |
| Adhesion to substrate | e | e | e | e | e | e | e | e | e | e | e | e |
| Filling time (100 nm) | ≤1 min | ≤1 min | ≤1 min | ≤1 min | ≤1 min | ≤1 min | ≤1 min | ≤1 min | ≤5 min | ≤1 min | ≤5 min | ≥15 min |
| Filling time (1000 nm) | ≤1 min | ≤1 min | ≤1 min | ≤1 min | ≤1 min | ≤1 min | ≤1 min | ≤1 min | ≤1 min | ≤1 min | ≤5 min | ≤10 min |
| Patten profile | f | f | f | f | f | f | f | f | f | f | f | f |
| Dry etching rate (nm/min) O$_2$ gas | 110 | 110 | 110 | 110 | 110 | 111 | 110 | 110 | 110 | 106 | 106 | 106 |
| Dry etching rate (nm/min) C$_3$F$_8$ gas | 117 | 117 | 117 | 117 | 117 | 112 | 117 | 117 | 110 | 118 | 113 | 112 |
| Ratio of dry etching rate O$_2$ gas | 0.588 | 0.588 | 0.588 | 0.588 | 0.588 | 0.594 | 0.588 | 0.588 | 0.588 | 0.567 | 0.567 | 0.567 |
| Ratio of dry etching rate C$_3$F$_8$ gas | 0.609 | 0.609 | 0.609 | 0.609 | 0.609 | 0.583 | 0.609 | 0.609 | 0.573 | 0.615 | 0.589 | 0.583 | e: excellent; g: good; f: fine; c: cohesive failure; u: uncured

Compositions 30-41 contain at least one surfactant. Surfactant A and Surfactant B are polymeric surfactants, while Surfactant C and Surfactant D contain at least one fluorine atom. Films obtained from all of such compositions show fine pattern profiles. Compositions 30-38 contain Compound G and Compound which are a silane coupling agent and a phosphoric acid, respectively.

Compositions 30-38 show good coating properties and excellent adhesion to substrate. Compound G and Compound H can contribute to improvement of adhesion to substrate concertedly.

Compositions 35-38, which contain two kinds of surfactants, show excellent coating properties and adhesion to substrate. This indicates that it is preferred that a polymeric surfactant and a surfactant containing at least one fluorine atom are added to compositions.

It is preferred that one of the two surfactants has a polymeric moiety containing carbon atoms more than 20. More preferably, such surfactant may have a moiety represented by the following equation:

a halogen atom, a substituent containing an oxygen atom, a sulfur atom, a carbon atom and a silicon atom.

Alternatively, such surfactant has the solubility parameter (SP) value ranging from 8.0 to 12.0. Preferably, the SP value may range from 9.5 to 10.0. The SP value is obtained by the following equation:

Formula 1

$$\text{Solubility Parameter} = \left( \frac{\sum_i \Delta e_i}{\sum_i \Delta v_i} \right)^{\frac{1}{2}} \quad (1)$$

where: $\Delta e_i$ is evaporation energy of atom or atomic group. $\Delta v_i$ is molar volume of atom or atomic group.

It is preferred that the other kind of surfactants contains at least one fluorine atom. More preferably, such surfactant may have a moiety represented by the following equation:

Formula 2

$$F-(CF_2)_k-Z \quad (II)$$

where: k is an integer which is equal to or greater than 1 and which is equal to or smaller than 20; and Z is a hydrogen atom, oxygen atom, carbon atom, sulfur atom or silicon atom.

Compositions 39-41 contain three monomers selected from the group consisting of Compounds A-F. More concretely, such compositions show excellent coating properties and adhesion to substrate. Such compositions contain a compound having only one polymerizable group and an aromatic group and a compound having plural polymerizable groups and an aromatic group. It is preferred that such compositions contain at least two kinds of monomer each of which contains at least two polymerizable groups and at least one aromatic group.

FIG. 1 shows a typical manufacturing process for a component utilizing a composition relating to an aspect of the disclosure.

The manufacturing process is as follows:

(A) A solution of a composition mentioned above is disposed on a substrate 2 by a spin-coating process to form a coating film 1 of the solution.

(B) A solvent contained in the solution is removed by heating the solution disposed on the substrate 2 to form a coating film 3 of the composition. A typical heating temperature and time for the removal of solvent are around 80 degrees Celsius and 2 minutes, respectively.

(C) The coating film 3 is sandwiched between a mold 4 and the substrate 2 by putting pressure upon at least one of the mold 4 and the substrate 2. A plurality of concave portions or a plurality of convex portions are formed in the mold 4.

(D) A resin 5 is formed by an irradiation of the composition with a light transmitted through any one of the substrate 2 and the mold 4. The resin 5 has a plurality of thicker portions and a plurality of thinner portions. A typical light source for the light irradiation is a xenon lamp or UV lamp. The energy density of the irradiation light is typically ca. 1 J/cm². It is preferred that the light irradiation is carried out typically under an inert gas atmosphere such as nitrogen atmosphere and argon atmosphere. After the resin 5 is formed, the mold 4 is separated from the resin 5.

(E) Dry etching is carried out for removing the plurality of thinner portions.

(F) After the dry etching process, the plurality of thicker portions are left on the substrate 2.

(G) A plurality of portion of the substrate 2 on which the plurality of thinner portions of the resin have been formed are etched to form a plurality of grooves.

(H) The plurality of thicker portions are removed by an ashing process to obtain a member 6 having a plurality of grooves. The member can be utilized for a component such as light guide plate and photomask.

Such component can be a component contained in a device or a component utilized for manufacturing a device.

The invention claimed is:

1. A composition comprising:
   a first compound;
   a second compound; and
   a silane coupling agent;
   wherein:
   the first compound has a structure represented by Formula (D):

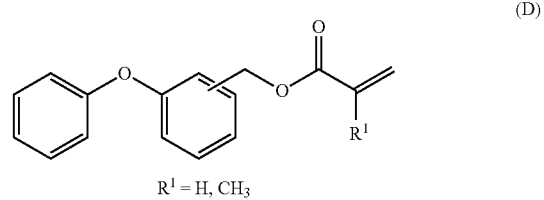

$R^1 = H, CH_3$ the second compound has at least two polymerizable groups;

the silane coupling agent is as represented by Formula (G):

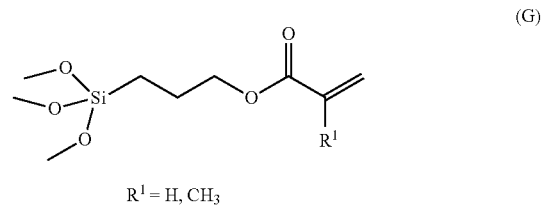

$R^1 = H, CH_3$ and a resin generated by curing the composition has a dry etching rate less than or equal to 140 nm/min.

2. The composition of claim 1, wherein the composition has a viscosity less than or equal to 104800 mPa·s.

3. The composition of claim 1, wherein the composition is photo-curable.

4. The composition of claim 1, wherein:
   the resin has a dry etching rate less than or equal to 131 nm/min; and
   the dry etching rate is measured in a plasma generated under a condition in which a flow rate of $O_2$ is 10 sccm.

5. The composition of claim 1, wherein the second compound that has at least two cyclic moieties.

6. The composition of claim 1, wherein the first compound has an Ohnishi parameter less than or equal to 2.60.

7. The composition of claim 1, wherein the first compound in itself has a viscosity less than or equal to 150 mPa·s.

8. The composition of claim 1, wherein the first compound has at least two cyclic moieties.

9. The composition of claim 1, wherein the first compound contains at most three oxygen atoms.

10. The composition of claim 1, wherein the composition has an Ohnishi parameter less than or equal to 2.59.

11. The composition of claim 1, wherein the second compound includes a fluorene structure.

12. The composition of claim 1, further comprising:
    at least one selected from the group consisting of a surfactant containing at least one fluorine atom and a polymeric surfactant.

13. The composition of claim 1, further comprising:
    a phosphoric acid.

14. The composition of claim 13, wherein the phosphoric acid is as represented by Formula (H):

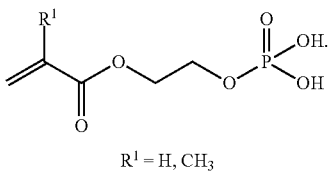

(H)

R¹ = H, CH₃

15. A method for manufacturing a component utilizing nanoimprint technology, the method comprising:
preparing the composition of claim 1;
forming a coating film of the composition;
contacting a mold having a concave portion and a convex portion with the coating film;
and
forming a resin by curing at least the composition so as to form a component having a plurality of concavities therein.

16. The method of claim 15, wherein each of the plurality of concavities has a width less than or equal to 1000 nm.

17. The method of claim 15, wherein each of the plurality of concavities has a width less than or equal to 100 nm.

18. The method of claim 15, further comprising:
etching the resin.

19. A method of manufacturing a device, the method comprising:
preparing the composition of claim 1;
forming a coating film of the composition;
forming a resin by curing the coating film; and
processing the resin to obtain a device.

20. The method according to claim 19, further comprising:
contacting a mold having a concave portion and a convex portion with the coating film,
wherein the resin has a plurality of concavities therein.

* * * * *